(12) United States Patent
Alzaher

(10) Patent No.: US 9,582,687 B2
(45) Date of Patent: Feb. 28, 2017

(54) RECONFIGURABLE INTEGRATOR/DIFFERENTIATOR CIRCUIT USING CURRENT FOLLOWER BASED SIMULATED INDUCTOR

(71) Applicant: KING FAHD UNIVERSITY OF PETROLEUM AND MINERALS, Dhahran (SA)

(72) Inventor: Hussain Abdullah Alzaher, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 14/992,358

(22) Filed: Jan. 11, 2016

(65) Prior Publication Data

US 2016/0335460 A1 Nov. 17, 2016

Related U.S. Application Data

(60) Provisional application No. 62/162,424, filed on May 15, 2015.

(51) Int. Cl.
*G06G 7/184* (2006.01)
*H03H 11/48* (2006.01)
*H03H 11/04* (2006.01)

(52) U.S. Cl.
CPC ............. *G06G 7/184* (2013.01); *H03H 11/04* (2013.01); *H03H 11/48* (2013.01)

(58) Field of Classification Search
USPC ................................ 327/335–336, 339, 345
See application file for complete search history.

(56) References Cited

U.S. PATENT DOCUMENTS 4,176,329 A * 11/1979 Moskowitz .............. G10H 1/06
  333/167
5,960,183 A   9/1999 Toumazou et al.
(Continued)

FOREIGN PATENT DOCUMENTS

WO    WO 98/21726 A1    5/1998

OTHER PUBLICATIONS

"PID Controller", Ecircuit Center, http://www.ecircuitcenter.com/Circuits/pid1/pid1.htm, Jun. 2014, 5 pages.
(Continued)

*Primary Examiner* — An Luu
(74) *Attorney, Agent, or Firm* — Oblon, McClelland, Maier & Neustadt, L.L.P.

(57) ABSTRACT

A reconfigurable integrator/differentiator circuit includes: a first input terminal; a first output terminal; a first current follower having a second input terminal, a second inverting output terminal providing feedback to the first input terminal, a third non-inverting output terminal being connected to the first output terminal, and a fourth inverting output terminal; a second current follower having a third input terminal, a fifth inverting output terminal providing feedback to the first output terminal, and a sixth non-inverting output terminal being connected to the first input terminal; a single capacitor being connected between the fourth inverting output terminal and ground; a first resistor being connected between the first input terminal and the second input terminal; and a second resistor being connected between the fourth inverting output terminal and the third input terminal.

12 Claims, 10 Drawing Sheets

(56) References Cited

U.S. PATENT DOCUMENTS 6,415,429 B1     7/2002   Grundy
6,981,090 B1   12/2005   Kutz et al.
7,439,764 B2   10/2008   Twigg et al.
9,306,508 B1 *   4/2016   Alzaher ................ H03F 3/347

OTHER PUBLICATIONS

Misha Kumar, et al., "Field Programmable Analog Array (FPAA) Based Shunt Active Filter Controller", IEEE Energy Conversion Congress and Exposition (ECCE), Sep. 15, 2012, pp. 1011-1016.
Peyman Ahmadi, et al., "Band-pass filters with high quality factors and asymmetric-slope characteristics", IEEE $54^{th}$ International Midwest Symposium on Circuits and Systems (MWSCAS), Aug. 7-10, 2011, 4 pages.

* cited by examiner

RECONFIGURABLE INTEGRATOR/DIFFERENTIATOR CIRCUIT USING CURRENT FOLLOWER BASED SIMULATED INDUCTOR

CROSS-REFERENCE TO RELATED APPLICATIONS

This application claims the benefit of U.S. Provisional Application Ser. No. 62/162,424, filed May 15, 2015, the entire contents of which are incorporated herein by reference.

TECHNICAL FIELD

The exemplary embodiments described herein are related to the field of reconfigurable integrators/differentiators.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Configurable analog blocks (CABs) are the central parts for Field Programmable Analog Arrays (FPAA) as described in A. Basu, S. Brink, C. Schlottmann, S. Ramakrishnan, C. Petre, S. Koziol, F. Baskaya, C. Twigg, and P. Hasler, ("A floating-gate-based field-programmable analog array," IEEE J. Solid-State Circuits, vol. 45, no. 9, pp. 1781-1794, September 2010—incorporated herein by reference) and A. Malcher, and P. Falkowski, ("Analog Reconfigurable Circuits," Intl. Journal of Electronics and Telecommunications, vol. 60, no. 1, pp. 15-26, March 2014—incorporated herein by reference). As recognized by the present inventor, one of the main problems of FPAA is speed which is directly related to the bandwidth of the circuits. Also, linearity of CABs is an important performance parameter deciding the upper limit of dynamic range. Circuits based on current follower have the potential to operate at higher frequency ranges and offer improved linearity over their counterparts based on the operational amplifier and transconductance amplifier, respectively. Therefore, they are proposed to be used in this application. However, as recognized by the present inventor, some circuit configurations may suffer from relatively low frequency operation. Consequently, a solution to this problem is suggested by the inventor.

SUMMARY

In one embodiment, there is provided a reconfigurable integrator/differentiator circuit, including: a first input terminal; a first output terminal; a first current follower having a second input terminal, a second inverting output terminal, a third non-inverting output terminal and a fourth inverting output terminal wherein the second inverting output terminal provides feed back to the first input terminal and the third non-inverting output terminal is directly connected to the first output terminal; a second current follower having a third input terminal, a fifth inverting output terminal, and a sixth non-inverting output terminal, wherein the fifth inverting output terminal provides feed back to the first output terminal, and the sixth non-inverting output terminal is directly connected to the first input terminal; a single capacitor being connected between the fourth inverting output terminal of the first current follower and ground; a first resistor being connected between the first input terminal and the second input terminal of the first current follower; and a second resistor being connected between the fourth inverting output terminal of the first current follower and the third input terminal of the second current follower In another embodiment, the first current follower and the second current follower include one or more differential pairs in parallel with a first output stage to provide multiple output currents.

In another embodiment, the first current follower and the second current follower include one or more differential pairs in parallel with a first output stage to provide multiple output currents.

In another embodiment, a transfer function of the circuit is set as:

$$I_{out} = sCR_2 I_{in}$$

wherein $I_{in}$ is an input current of the circuit, C is a capacitance of the single capacitor, and $R_2$ is a resistance of the second resistor.

In another embodiment, there is provided another reconfigurable integrator/differentiator circuit, including: a first input terminal; a first output terminal;
a first current follower having a second input terminal, a second inverting output terminal, a third non-inverting output terminal and a fourth inverting output terminal, wherein the second inverting output terminal provides feed back to the first input terminal, and the third non-inverting output terminal is directly connected to the first output terminal;
a second current follower having a third input terminal, a fifth inverting output terminal, and a sixth non-inverting output terminal, wherein the sixth non-inverting terminal is connected to the third non-inverting terminal of the first current follower;
a third current follower having a fourth input terminal, a seventh inverting output terminal, and an eighth non-inverting output terminal, wherein the seventh inverting output terminal provides feed back to the fourth inverting output terminal of the first current follower, and the eighth non-inverting output terminal is directly connected to the first input terminal; a single capacitor being connected between the fourth inverting output terminal of the first current follower and ground; a first resistor being connected between the first input terminal and the second input terminal of the first current follower; a second resistor being connected between the fifth inverting output terminal of the second current follower and the fourth input terminal of the third current follower; and a third resistor being connected between the seventh inverting output terminal of the third current follower and the third input terminal of the second current follower.

In another embodiment, respective input stages and output stages of the first current follower and the second current follower operate independently through controlling a biasing current at the output stages.

In another embodiment, the circuit operates as an integrator when output stages of the first current follower are turned on and output stages of the second current follower are turned off, and the circuit operates as a differentiator when the output stages of the first current follower are turned off and the output stages of the second current follower are turned on.

In another embodiment, output currents of the circuit are set as:

$$I_{Diff} = sCR_2 I_{in}$$

$$I_{Intg} = \frac{1}{sCR_3} I_{in}$$

wherein $I_{in}$ is an input current of the circuit, C is a capacitance of the single capacitor, and $R_2$ is a resistance of the second resistor, and $R_3$ is a resistance of the third resistor.

In another embodiment, a function of the circuit is obtained by setting the unwanted current between $I_{Diff}$ and $I_{Intg}$ to zero.

In another embodiment, there is provided a simulated inductor, including: a first input terminal; a first current follower having a second input terminal, a first inverting output terminal and a second non-inverting output terminal, wherein the second inverting output terminal provides feedback to the first input terminal; a second current follower having a third input terminal, a third inverting output terminal, and a fourth non-inverting output terminal, wherein the third inverting output terminal provides feedback to the second non-inverting output terminal of the first current follower, and the forth non-inverting output terminal is connected to the first input terminal; a single capacitor being connected between the second non-inverting output terminal of the first current follower and ground; a first resistor being connected between the first input terminal and the second input terminal of the first current follower and a second resistor being connected between the second non-inverting output terminal of the first current follower and the third inverting input terminal of the second current follower.

In another embodiment, an input impedance of the inductor is set as:

$$Z = sCR_1R_2$$

wherein C is a capacitance of the single capacitor, $R_1$ is a resistance of the first resistor and $R_2$ is a resistance of the second resistor.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
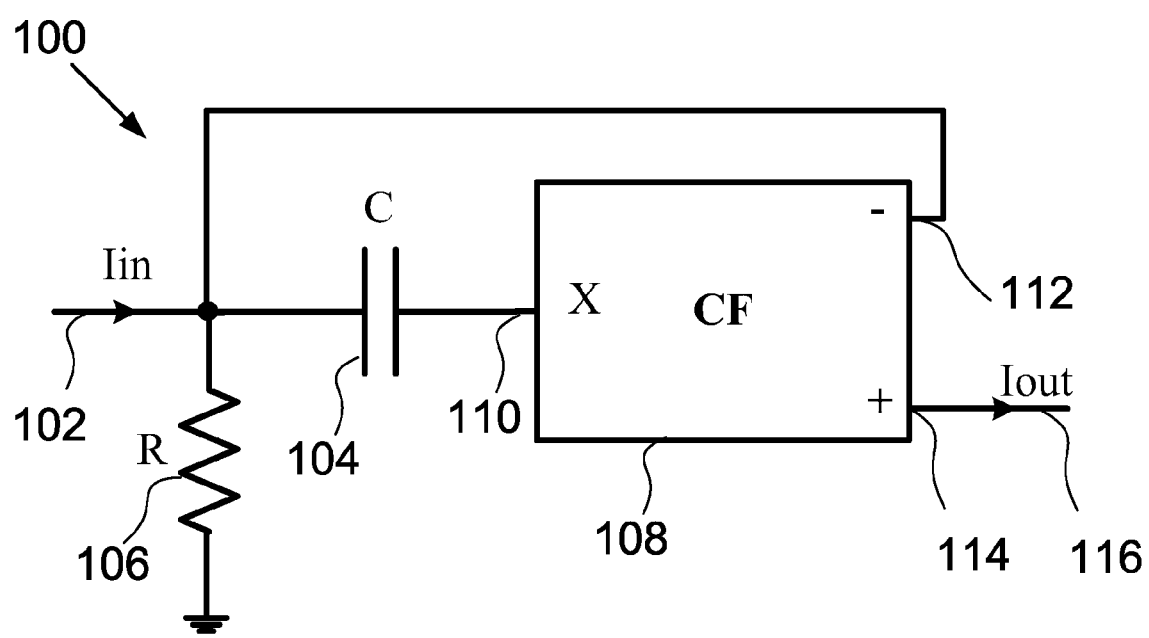
FIG. 1 is an exemplary circuit schematic of a basic current-follower based cascadable differentiator.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "about," and similar terms generally refer to ranges that include the identified value within a margin of 20%, 10%, or preferably 5%, and any values therebetween.

The following is an assessment of publications and is intended not only as a review of conventional approach, but also on the inventor's recognition of attributes and limitation of these approaches, which set a baseline for the novel embodiments described herein.

Analog configurable analog blocks (CABs) based on active-RC require relatively large current consumptions to operate in MHz ranges as described in C. A. Looby and C. Lyden, ("Op-amp based CMOS field-programmable analogue array," Proc. IEE Circuits Dev. Syst., vol. 147, pp. 93-95, 2000—incorporated herein by reference). [3]. Whereas, transconductance amplifier (gm) based CABs that are described in B. Pankiewicz, M., Wojcikowski, S., Szczepanski, Y. Sun, ("A field programmable analog array for CMOS continuous time OTA-C filter applications," IEEE J. Solid-State Circuits, vol. 37, no. 2, pp. 125-136, February 2002—incorporated herein by reference), S. A. Mahmoud, ("Digitally controlled CMOS balanced output transconductor and application to variable gain amplifier and Gm-C filter on field programmable analog array," J. Circuits Syst. Comput., vol. 14, pp. 667-684, 2005—incorporated herein by reference), F. Henrici, J. Becker, A. Buhmann et al., ("A Continuous-Time Field Programmable Analog Array Using Parasitic Capacitance Gm-C Filters," *ISCAS*, pp. 2236-2239, 2007—incorporated herein by reference), Trendelenburg, S., De Dorigo, D., Henrici, F., Becker, J., Manoli, Y, ("Instantiation of high order filters on a continuous-time field-programmable analog array" MWSCAS 2008. 51st Midwest Symposium on Circuits and Systems, 10-13 pp. 294-297, August 2008—incorporated herein by reference), can operate at higher bandwidths but suffer from limited linearity particularly for low supply voltages as described in in Y. P. Tsividis, "Integrated Continuous-Time Filter Design-An Overview," IEEE J. Solid-State Circuits, vol. 29, pp. 166-176, March 1994—incorporated herein by reference). Current-mode active elements, like the second generation current conveyor (CCII) and the current feedback amplifier (CFA) exhibit attractive characteristics such as wide frequency operating range, low power, high linearity, high slew rate and simple circuitry in G. Cataldo, A. Grasso, and S. Pennisi, ("Two CMOS Current Feedback Operational Amplifiers," IEEE Tran. on Circuits and Systems-II, vol. 54, pp. 944-948, 2007—incorporated herein by reference) [9]. But the main problem with CCII or CFA based CABs such as V. C. Gaudet and P. G. Gulak, "CMOS implementation of a current conveyor-based field programmable analog array," Conf. Record of the Third-First Asilomar Conf. Signals, Systems and Computers, vol. 2, p. 1156, 1997—incorporated herein by reference), C. Premont, R. Grisel, N. Abouchi, J.-P. Chante, "A current conveyor based field programmable analog array," Analog Integrated Circuits and Signal Processing, vol. 17, no. 1, pp. 105-124, 1998—incorporated herein by reference), A. M. Madian, S. A. Mahmoud and A. M. Soliman, "Configurable analog block based on CFOA and its application," WSEAS Trans. Electron., vol. 5, pp. 26-31, 2008—incorporated herein by reference), S. A. Mahmoud and E. A. Soliman, ("Low voltage current conveyor-based field programmable analog array," Journal of Circuits, Systems, and Computers, vol. 20, no. 8, pp. 1677-1701, 2011—incorporated herein by reference) is the complexity of the active elements. The complexity is automatically negatively reflected in the power consumption, dynamic range and area efficiency. In addition, VFs usually suffer from a limited input/output signal swing especially when operated from a low supply voltage S. A. Mahmoud and E. A. Soliman, ("Low voltage current conveyor-based field programmable analog array," Journal of Circuits, Systems, and Computers, vol. 20, no. 8, pp. 1677-1701, 2011—incorporated herein by reference). This will limit the dynamic range of circuits based on CCIIs and CFAs.

The second general problem with available solutions is that the number of functions implemented is relatively limited since most of the circuits use MOS transistor based switches. Traditionally, FPAAs structures interconnection networks are implemented using switches or pass transistors. In addition, to the nonlinearity associated with these switches as described in T. W. Brown, T. S. Fiez, and M. Hakkarainen, ("Prediction and characterization of frequency dependent MOS switch linearity and the design implications," Custom Integrated Circuits Conference, pp. 237-240, September 2006—incorporated herein by reference), the parasitic of numerous switches dramatically degrade the system performance as the array size increases as described in J. Becker, F. Henrici, S. Trendelenburg, M. Ortmanns, and Y. Manoli, ("A continuous-time hexagonal field-programmable analog array in 0.13 µm CMOS with 186 MHz GBW," IEEE Int. Solid-State Circ. Conf., pp. 70-71, February 2008—incorporated herein by reference). A possible solution to this problem is through replacing the interconnection network by direct connection between on/off CABs as suggested in as suggested in J. Becker, F. Henrici, S. Trendelenburg, M. Ortmanns and Y. Manoli, "A field programmable analog array of 55 digitally tunable OTAs in a hexagonal lattice", IEEE J. Solid-State Circuits, vol. 43, pp. 2759-2768, 2008—incorporated herein by reference).

The CFs or more generally current amplifiers (CAs) do not suffer from the problems of limited input/output signal swing of CCII or CFA and have higher bandwidth. Therefore, it is attractive to design CABs based on CFs only. In fact, the bandwidth and the closed-loop gain are almost independent and a high voltage swing is not usually required as described in Pennisi, S.: 'A low-voltage design approach for class-AB current-mode circuits', IEEE Trans. Cir. Syst. II, vol. 49, no. 4, pp. 273-279, April 2002—incorporated herein by reference), Palmisano, G., Palumbo, G., and Pennisi, S.: 'High-drive CMOS current amplifier', IEEE J. Solid State Circuits, vol. 33, no. 2, pp. 228-236, February 1998—incorporated herein by reference), and H. Alzaher, O. Al-Ees, and N. Tasadduq, "Programmable Multi-Gain Current Amplifier," IET Circuits, Devices & Systems, vol. 6, no. 6, p. 421-428, November 2012—incorporated herein by reference). From a certain point of view, it is the simplest current-mode device since it is a subpart of several devices such as CCII, current feedback amplifier (CFA) and transresistance amplifier (TRA) as described in Elwan, H., Soliman, A. M., and Ismail, M., ("A CMOS Norton amplifier-based digitally controlled VGA for low-power wireless applications", IEEE Trans. Cir. Syst. II, vol. 48, no. 3, pp. 245-254, March 2001—incorporated herein by reference). Therefore, such structures are expected to work at relatively high frequencies with an improved dynamic range, lower power consumption and less area. Switches in a signal path are avoided through adopting direct connection between on/off CABs as described in J. Becker, F. Henrici, S. Trendelenburg, M. Ortmanns and Y. Manoli, "A field programmable analog array of 55 digitally tunable OTAs in a hexagonal lattice", IEEE J. Solid-State Circuits, vol. 43, pp. 2759-2768, 2008—incorporated herein by reference) following a similar procedure explained in S. A. Mahmoud and E. A. Soliman, ("Low voltage current conveyor-based field programmable analog array," Journal of Circuits, Systems, and Computers, vol. 20, no. 8, pp. 1677-1701, 2011—incorporated herein by reference).

A CF is a two terminal device that conveys a current input signal applied at its low impedance input terminal X to a high impedance output terminal Z. Ideally, it is equivalent to a current controlled current source with unity gain, zero input impedance and infinite output impedance as described in P. Allen and M. Terry "The use of current amplifiers for high performance voltage applications", IEEE J. Solid State Circuits, vol. 15, no. 2, pp. 155-162, April 1980—incorporated herein by reference). Mathematically these relation can be written as $I_z=\pm I_x$ and $V_x=0$ and $V_z$ can be set to an arbitrary value. The positive sign denotes inverting CF while the negative sign means non-inverting CF. In current-mode processing, addition and subtraction are simply obtained by connecting respective wires.

Developing a cascadable current mode integrator based on CA includes two options. The first option is through applying the input current at the input terminal X and connecting a shunt integrating capacitor at the output terminal Z to perform integration. Then, the voltage of the capacitor is converted to an output current using a voltage to current converter.

FIG. 1 is an exemplary schematic of a CF based cascadable differentiator 100. The differentiator 100 includes a resistor 106, a capacitor 104, and a CF circuit 108. The capacitor 104 is connected between a current input terminal 102 and an input terminal 110 of the CF circuit 108. The resistor 106 is connected between the current input terminal 102 and a ground node. The CF circuit includes the input terminal 110, a non-inverting output 114 and an inverting output 112. The inverting output 112 feeds back the current signal to the input terminal 102, and the non-inverting output terminal 114 is connected to an output current terminal 116.

The transfer function of the differentiator 100 is described as:

$$I_{out}=sCRI_{in} \quad (3)$$

In the time domain, this relation can be expressed as:

$$I_{out} = CR\frac{dI_{in}}{dt} \quad (4)$$

As recognized by the present inventor, the differentiator circuit of FIG. 1 has the disadvantage of employing a capacitor in series with the input port of the CF. The non-ideal terminal characteristic of the X terminal can be approximated by series parasitic resistance at low frequency and inductive impedance at high frequency. The parasitic impedance is dominant at high frequency and hence degrades the operation of the differentiator. Alternatively, the proposed differential circuit in FIG. 2 can avoid this problem.

Figure 2:
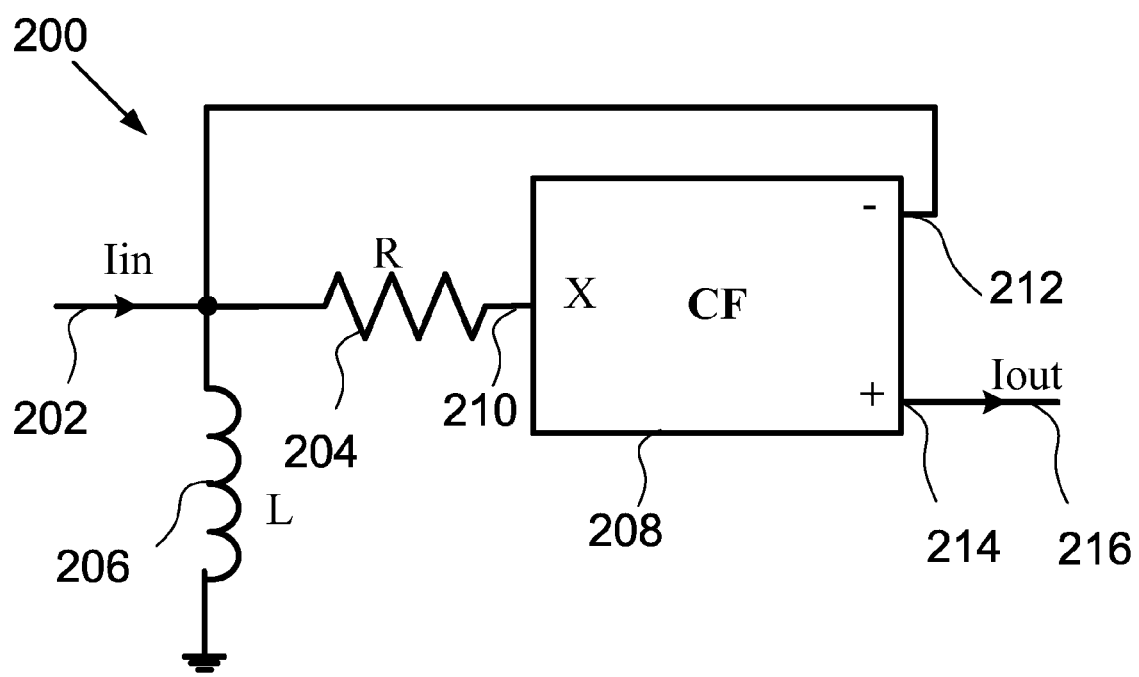
FIG. 2 is an exemplary circuit schematic of disclosed current-follower based cascadable differentiator.

FIG. 2 is an exemplary schematic of a CF based cascadable differentiator 200 using simulated inductor. The differentiator 200 includes an inductor 206, a resistor 204, and a CF circuit 208. The resistor 204 is connected between a current input terminal 202 and an input terminal 210 of the CF circuit 208. The inductor 206 is connected between the current input terminal 202 and a ground node. The CF circuit includes the input terminal 210, a non-inverting output 214 and an inverting output 212. The inverting output 212 feeds back the current signal to the input terminal 202, and the non-inverting output terminal 214 is connected to an output current terminal 216.

The voltage across the inductor 206 is $$L\frac{dI_{in}}{dt}$$

and hence $I_{out}$ can be expressed as $$\frac{L}{R}\frac{dI_{in}}{dt}.$$

In the frequency domain the output current is described as:

$$I_{out} = s\frac{L}{R}I_{in} \quad (3)$$

Figure 3:
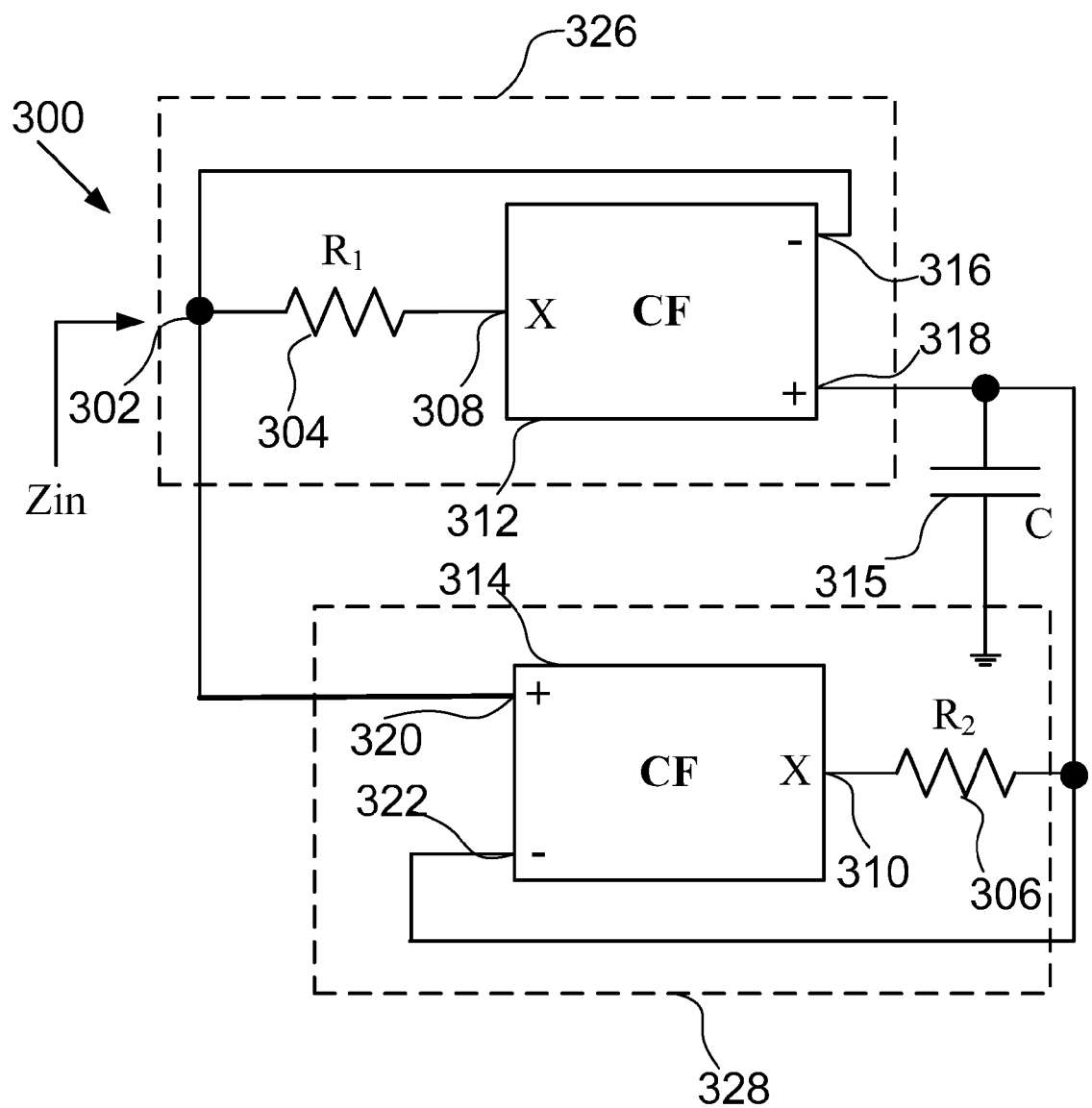
FIG. 3 is an exemplary circuit schematic of a disclosed simulated inductor.

A simulated inductor based on two dual-output CFs is shown in FIG. 3.

The simulated inductor 300 includes two resistors (304 and 306), a capacitor 315, and two CF circuits (312 and 314). A first resistor 304 is connected between an input terminal 302 and an input terminal 308 of a first CF circuit 312. The capacitor 315 is connected between the current output terminal 318 of the first CF circuit 312 and the ground. The first CF circuit 312 includes the input terminal 308, an inverting output 316 and a non-inverting output 318. The inverting output 316 feeds back the current signal to the input terminal 302. The second CF circuit 314 includes the input terminal 310, a non-inverting output 320 and an inverting output 322. The inverting output 322 feeds back the current signal to the output terminal 324, and the non-inverting output terminal 320 is connected to the input terminal 302. A second resistor 306 is connected between the non-inverting output terminal 318 of the first CF circuit 312 and the input terminal 310 of the second CF circuit 314. The first resistor 304 and the first CF circuit form a first voltage to current converter 326 by connecting the first resistor 306 in a first negative feedback loop. The second resistor 306 and the second CF circuit form a second voltage to current converter 328 by connecting the second resistor 306 in a second negative feedback loop.

The operation of the inductor 300 can be explained as follows. The voltage $V_c$ across the capacitor 315 is given by:

$$V_c = \frac{1}{sCR_1}V_{in} \quad (4)$$

whereas, the input current can be expressed by:

$$I_{in} = \frac{V_c}{R_2} \quad (5)$$

Solving equations (4) and (5) for an input impedance $Z_{in}$ leads to:

$$Z_{in} = \frac{V_{in}}{I_{in}} = \frac{sCR_1V_c}{\frac{V_c}{R_2}} = sCR_1R_2 \quad (6)$$

Figure 4:
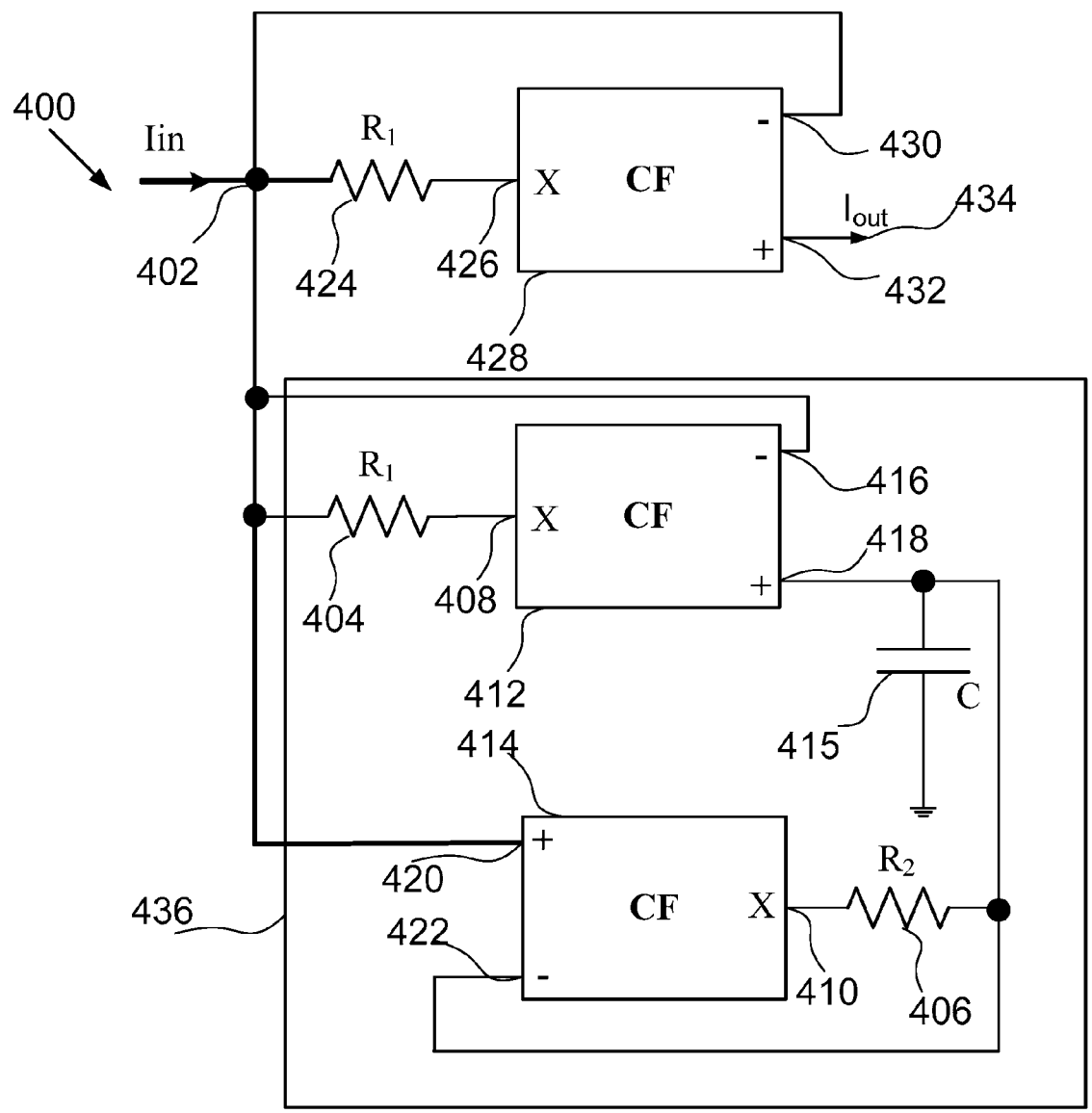
FIG. 4 is an exemplary circuit schematic of a disclosed complete differentiator based on the simulated inductor.

Utilizing the simulated inductor of FIG. 3, the complete differentiator circuit 400 is now shown in FIG. 4.

FIG. 4 is an exemplary schematic of differentiator circuit based on the simulated inductor. The Reconfigurable Differentiator Circuit 400 includes a first resistor 424, a simulated inductor 436, and a first CF circuit 428. A first resistor 424 is connected between an input terminal 402 and an input terminal 426 of a first CF circuit 428. The first CF circuit 428 includes the input terminal 308, an inverting output 316 and a non-inverting output 318. The inverting output 430 feeds back the current signal to the input terminal 402, and the non-inverting output terminal 432 is connected to an output current terminal 434.

The simulated inductor 430 includes two resistors (404 and 406), a capacitor 415, and two CF circuits (412 and 414). A second resistor 404 is connected between an input terminal 402 and an input terminal 408 of a second CF circuit 412. The capacitor 415 is connected between the current output terminal 418 of the second CF circuit 412 and the ground. The second CF circuit 412 includes the input terminal 408, an inverting output 416 and a non-inverting output 418. The inverting output 416 feeds back the current signal to the input terminal 402. The third CF circuit 414 includes the input terminal 410, a non-inverting output 420 and an inverting output 422. The inverting output 422 feeds back the current signal to the non-inverting output terminal 418 of the second CF circuit, and the non-inverting output terminal 420 is connected to the input terminal 402. A third resistor 406 is connected between the non-inverting output terminal 418 of the second CF circuit and the input terminal 410 of the third CF circuit 414.

The transfer function of the differentiator 400 shown in FIG. 4 is described as:

$$I_{out} = s\frac{CR_1R_2}{R}I_{in} \quad (7)$$

Figure 5:
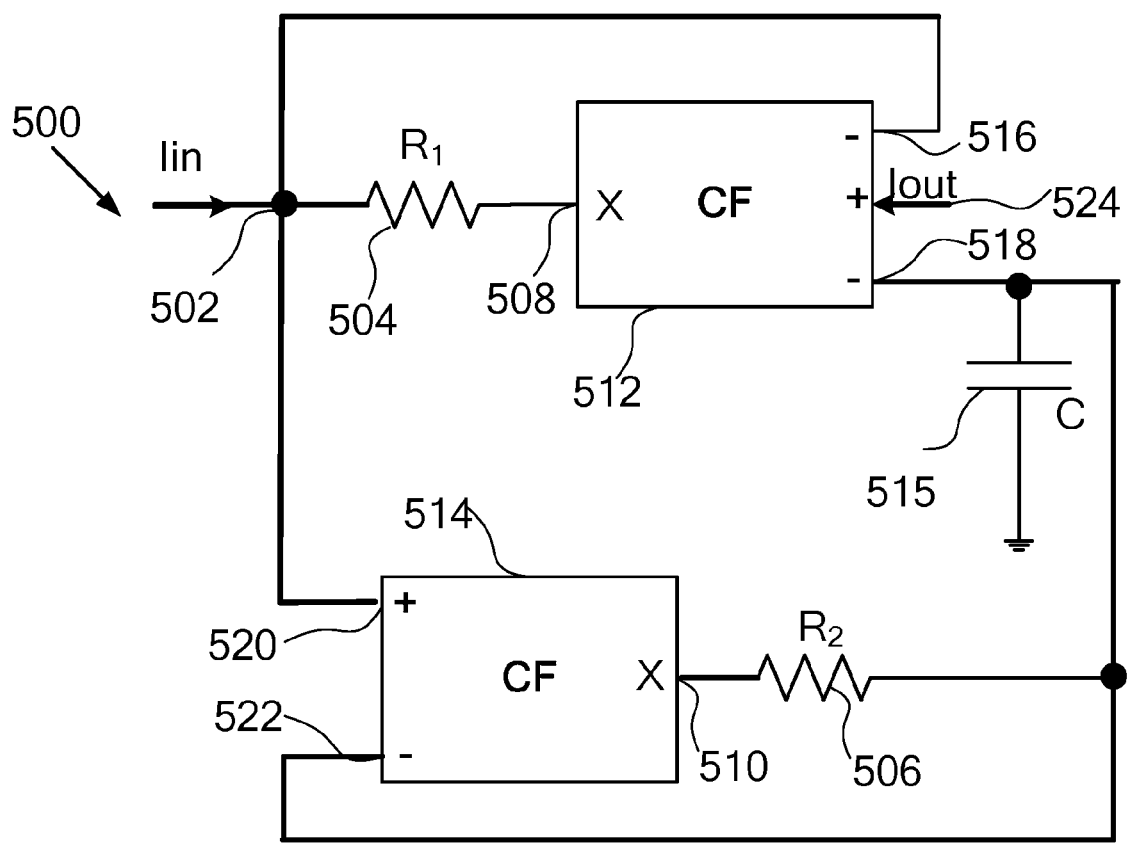
FIG. 5 is an exemplary circuit schematic of a disclosed simplified differentiator based on the simulated inductor.

The differentiator 400 in FIG. 4 can be simplified as the differentiator 500 shown in FIG. 5 by removing unnecessary CF circuit and resistor.

FIG. 5 is an exemplary schematic of simplified differentiator circuit 500 based on the simulated inductor. The reconfigurable differentiator circuit 500 includes two resistors (504 and 506), two CF circuits (512 and 514), and a capacitor 515. A first resistor 504 is connected between an input terminal 502 and an input terminal 508 of a first CF circuit 512. The first CF circuit 518 includes the input terminal 508, a first inverting output 516, a second inverting output 518 and a non-inverting output 524. The first inverting output 516 feeds back the current signal to the input terminal 502. A second CF circuit 514 includes the input terminal 510, a non-inverting output 520 and an inverting output 522. The inverting output 422 feeds back the current signal to the second inverting output terminal 518 of the first CF circuit, and the non-inverting output terminal 520 is connected to the input terminal 502. A second resistor 506 is connected between the non-inverting output terminal 518 of the first CF circuit and the input terminal 510 of the second CF circuit 514.

The transfer function of the differentiator 400 shown in FIG. 4 is described as:

$$I_{out} = sCR_2 I_{in} \qquad (8)$$

Figure 6:
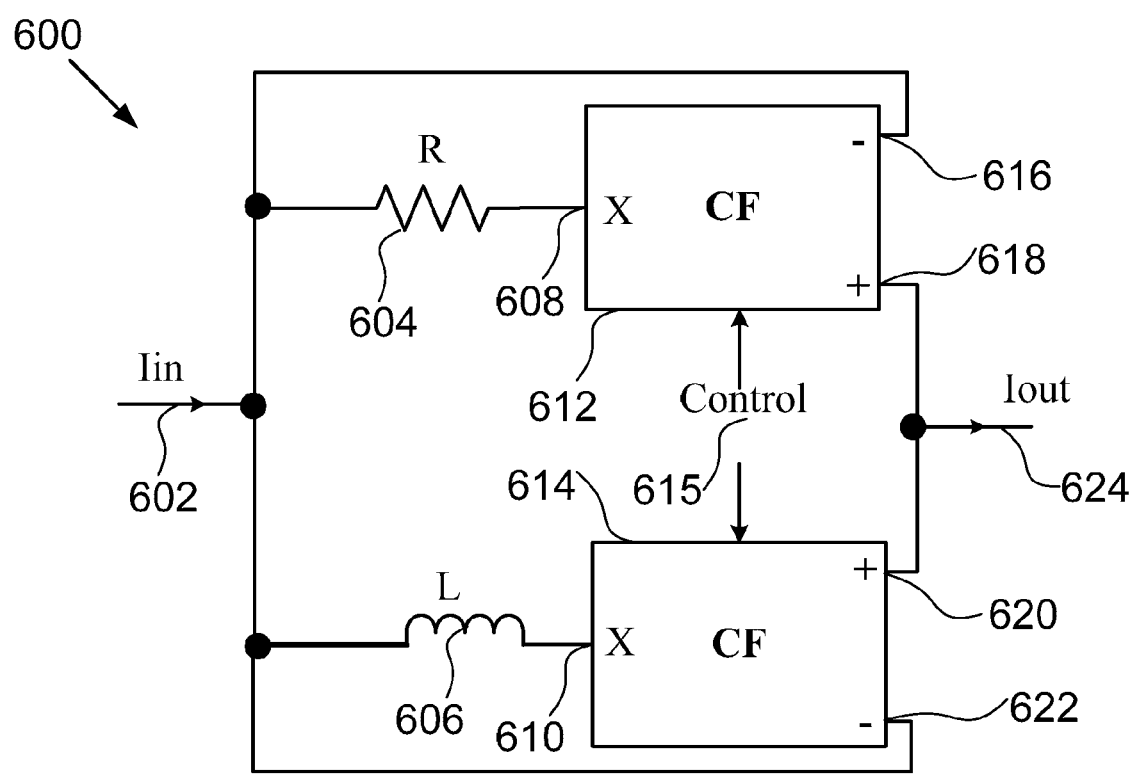
FIG. 6 is an exemplary circuit schematic of a disclosed reconfigurable integrator/differentiator with a floating simulated inductor.
Figure 7:
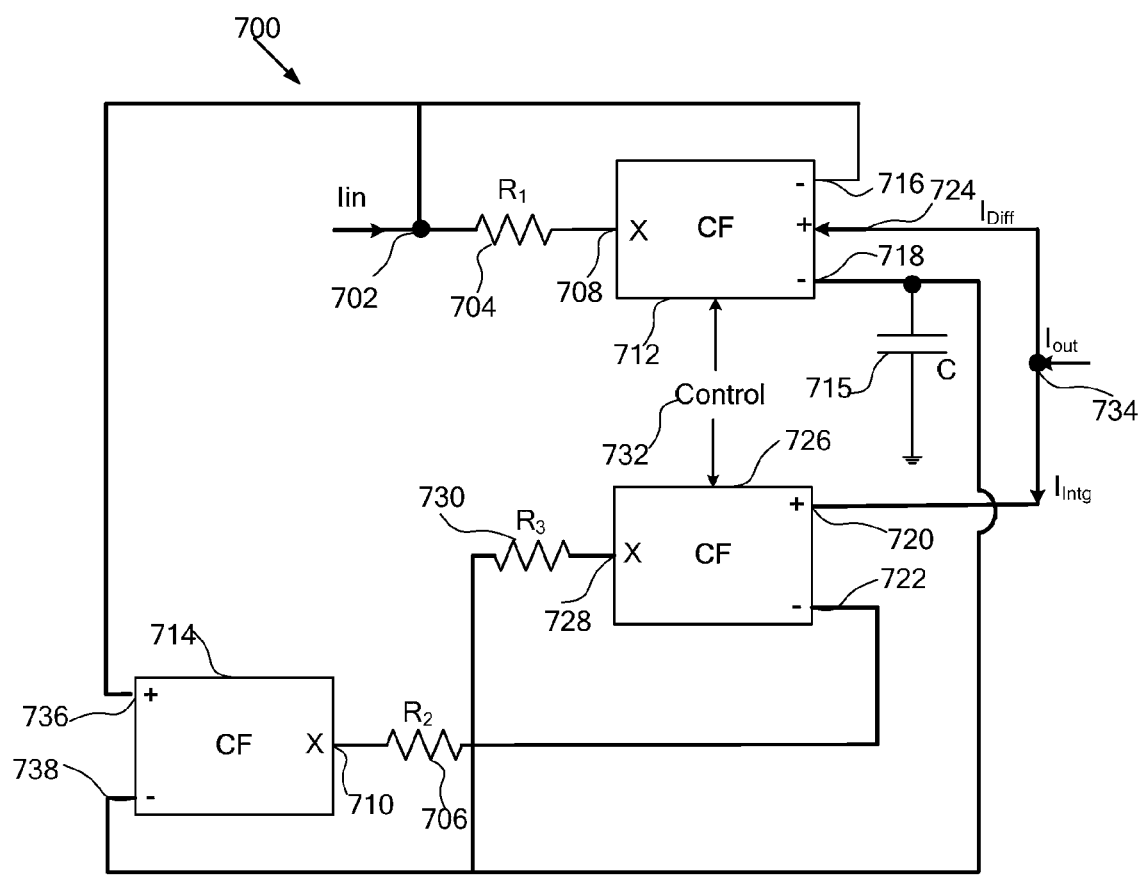
FIG. 7 is an exemplary circuit schematic of another disclosed reconfigurable integrator/differentiator.

A reconfigurable integrator/differentiator circuit 600 is shown in FIG. 6.

The Reconfigurable Integrator/Differentiator Circuit 600 includes a resistor 604, a inductor 606, and two CF circuit (612 and 615). The resistor 604 is connected between a current input terminal 602 and an input terminal 608 of a first CF circuit 612. The inductor 606 is connected between the current input terminal 602 and an input terminal 610 of a second CF circuit 614. The first CF circuit 612 includes the input terminal 608, an inverting output 616 and a non-inverting output 618. The inverting output 616 feeds back the current signal to the input terminal 602, and the non-inverting output terminal 618 is connected to an output current terminal 624. The second CF circuit 614 includes the input terminal 310, a non-inverting output 620 and an inverting output 622. The inverting output 622 feeds back the current signal to the input terminal 602, and the non-inverting output terminal 620 is connected to an output current terminal 624. A control signal 615 is used to configure the circuit 600 to operate either as a differentiator or an integrator. However, the reconfigurable integrator/differentiator circuit 600 requires the floating simulated inductor 606.

Moreover, based on the circuit 400 in FIG. 4, an alternative reconfigurable integrator/differentiator circuit 700 can be designed.

The reconfigurable integrator/differentiator Circuit 700 includes three resistors (704, 706 and 730), three CF circuits (712, 714 and 726), and a capacitor 715. A first resistor 704 is connected between an input terminal 702 and an input terminal 708 of a first CF circuit 712. The first CF circuit 712 includes the input terminal 708, a first inverting output 716, a second inverting output 718, and a non-inverting output 724. The first inverting output 716 feeds back the current signal to the input terminal 702, and the non-inverting output terminal 724 is connected to an output current terminal 734.

A second CF circuit 726 includes the input terminal 728, an inverting output 722, and a non-inverting output 720. A third CF circuit 714 includes the input terminal 710, an inverting output 738, and a non-inverting output 736.

A second resistor 404 is connected between the input terminal 710 of the third CF circuit 714 and the inverting output terminal 722 of the second CF circuit 726. The capacitor 715 is connected between the second inverting output terminal 718 of the first CF circuit 412 and the ground. The non-inverting output terminal 724 of the first CF circuit 712 and the non-inverting output terminal 720 are connected the $I_{out}$ 734. A third resistor 730 is connected between the input terminal 728 of the second CF circuit 726 and an inverting output terminal 738 of the third CF circuit 714. A control signal 732 is used to configure the circuit 700 to operate either as a differentiator or an integrator. The current from the non-inverting terminal 724 of the first CF circuit 712 is the differentiator current $I_{diff}$, while the current from the non-inverting terminal 720 of the second CF circuit 726 is the integrator current $I_{intg}$.

The intgeration function of the circuit 700 can be obtained from the voltage Vc across the capacitor 718. The differentiator/integrator function can be obtained through setting the unwanted current between $I_{Diff}$ and $I_{Intg}$ to zero. The differentiator current $I_{Diff} = sCR_2 I_{in}$ is described in (8), whereas the integrator output current is described as:

$$I_{Intg} = \frac{1}{sCR_3} I_{in} \qquad (9)$$

In order to obtain negative current from the integrator and differentiator, a positive output stage of the CF circuits can be used instead of a negative output stage. The disclosed circuit 700 is attractive for low power consumption and area due to the use of small amount of the passive and active components. Moreover, the circuit 700 exhibits independent control of the time constants through $R_1$ and $R_2$ for the integrator and differentiator respectively, in addition to the inherently better frequency response.

Figure 8:
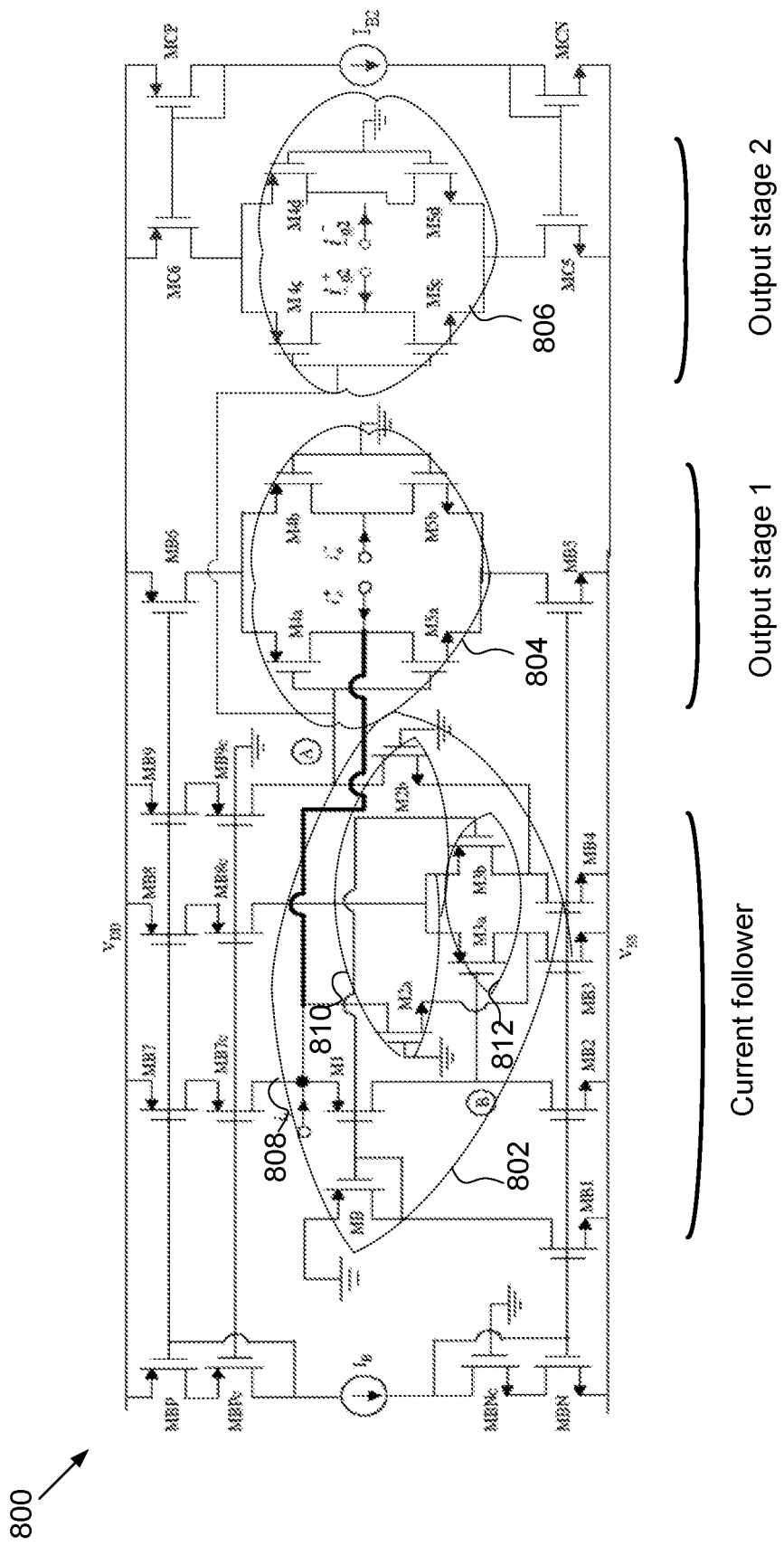
FIG. 8 is an exemplary circuit schematic of a multi-output current follower.

The proper operation of the circuit requires that the virtual ground $V_x = 0$ of the CFs always be maintained. However, the respective output currents are set to zero depending on the type of the required operation. This would require a particular CMOS realization wherein the operation of the input and output stages are independent. FIG. 8 is an exemplary schematic of the CF circuit used in the disclosed reconfigurable integrator/differentiator circuits.

As shown in FIG. 8, the CF circuit 800 includes a current follower circuit 802, a first output stage 804 and a second output stage 806. Transistors MB and M1 have the same length and width, and are biased with the same quiescent currents through current source transistor MB1 and MB2. Since the two transistors MB and M1 have the same gate-source voltages and $V_S(M1) = V_S(MB) = 0$, this makes the DC voltage at the input node 808 to be equal to zero. The transistors M2-M3 and current generators transistors MB7, MB7c, MB8, MB8c, MB9 and MB9c, implement an auxiliary differential stage. A first differential pair 810 is implemented by the transistors M2a-M2b. The gates of the transistors M2a-M2b are connected to the ground node. A second differential pair 812 is implemented by the transistors M3a-M3b. The gates of the transistor M3a-M3b are biased as the drain voltage of the transistors MB and M1, thereby minimizing the errors in the input bias voltage caused by channel length modulation. The first and second differential pairs 810 and 812 form a folded-cascade structure, and the second differential pair 812 are implemented by p-channel transistors. The folded cascade differential amplifier allows a reduced supply voltage.

The first output stage 804 is implemented by a third complementary differential pair M4a-M4b and M5a-M5b. The differential output currents from the first output stage 804 are a non-inverting current output $i_o^+$ and an inverting current output $i_o^-$. The second output stage 806 is implemented by a fourth complementary differential pair M4c-M4d and M5c-M5d. The differential output currents from the second output stage 806 are a non-inverting current output $i_{o2}^+$ and an inverting current output $i_{o2}^-$. The second output stage 806 is connected in parallel with original output stage M4a-M4b and M5a-M5b to provide additional current outputs.

By feeding the non-inverting output current ($i_o^+$) of the first output stage 404 to the input current $i_i$, a closed-loop unity gain configuration is achieved. A feedback from the closed loop reduces the initially small open loop resistance ($1/g_{m1}$). Therefore, the virtual ground property is satisfied for both DC and ac operation. Furthermore feedback loop adjust the negative output current ($i_o^-$) to closely follow the input current ($i_i$).

When the two output stages are biased with same tail currents (e.g., $I_{B2}=I_B$), the magnitude of the three currents $i_o^-$, $i_{o2}^-$ and $i_{o2}^+$ would be equal with their respective directions shown in FIG. 8. Extra output currents can be obtained by adding more output stages with each stage providing both positive and negative signals. Furthermore $i_{o2}^-$ and $i_{o2}^+$ can be set to zero independently through switching off the biasing current ($I_{B2}$).

Figure 9:
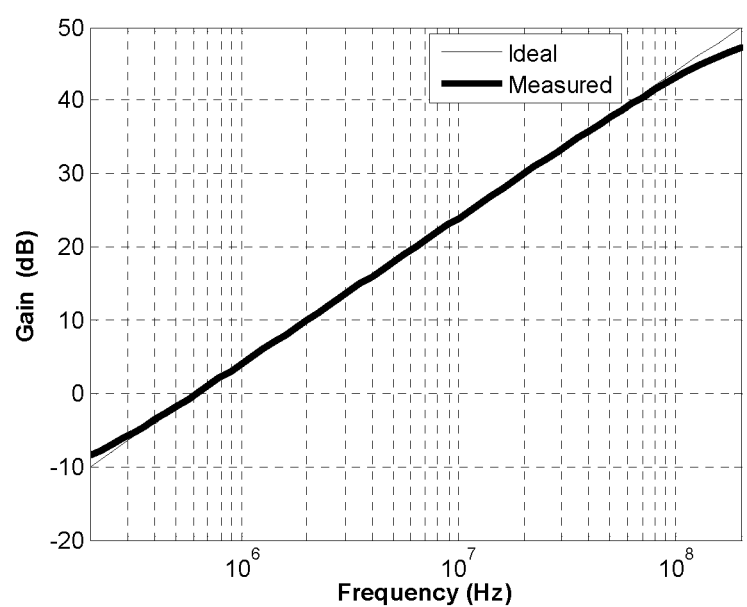
FIG. 9 is a graph that shows AC responses of the disclosed reconfigurable integrator/differentiator functioning as an integrator.
Figure 10:
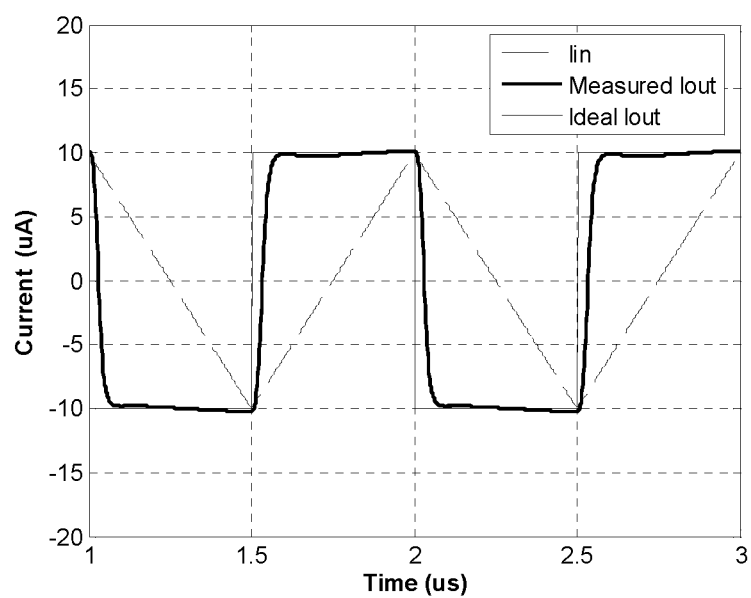
FIG. 10 is a graph that time domain testing of the disclosed reconfigurable integrator/differentiator functioning as a differentiator.

The differentiator/integrator 700 was fabricated in 0.35 μm process. The supply voltages and biasing current of the CF are set to ±3.5/2V and $I_B$=30 μA leading to a total power ($V_{DD} \times 10 I_B + V_{SS} \times 11 I_B$) of approximately 1 mW. The AC response of differentiator/integrator 700 is shown in FIG. 9. The simulation results closely follow the measurement response over the operating range. The response of the differentiator due to a triangular-wave input with an amplitude of 10 uA and a frequency of 500 kHz is shown in FIG. 10. The simulation results and the ideal results are in good agreements. The slight delay in the response is mainly due to finite output resistances of the CF circuit.

The disclosed circuit discloses an integrator/differentiator the exhibits better frequency response compared to the state-of-art similar type of circuit with an extensive operating frequency of 100 MHz. A single capacitor is utilized for both integration and differentiation operations leading to considerable area saving particularly when large capacitors were required. Also, the circuit does not suffer from the problems of limited input/output signal swing associated with the voltage followers employed, for example, in CCII or CFA. The switches in a signal path are avoided through adopting direct connection between on/off output stages of the CFs.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, define, in part, the scope of the foregoing claim terminology such that no inventive subject matter is dedicated to the public.

The invention claimed is:

1. A reconfigurable integrator/differentiator circuit, comprising:
   a first input terminal;
   a first output terminal;
   a first current follower having a second input terminal, a second inverting output terminal, a third non-inverting output terminal and a fourth inverting output terminal wherein the second inverting output terminal provides feed back to the first input terminal and the third non-inverting output terminal is directly connected to the first output terminal;
   a second current follower having a third input terminal, a fifth inverting output terminal, and a sixth non-inverting output terminal, wherein the fifth inverting output terminal provides feed back to the first input terminal, and the sixth non-inverting output terminal is directly connected to the first output terminal;
   a single capacitor being connected between the fourth inverting output terminal of the first current follower and ground;
   a first resistor being connected between the first input terminal and the second input terminal of the first current follower; and
   a second resistor being connected between the fourth inverting output terminal of the first current follower and the third input terminal of the second current follower.

2. The circuit of claim 1, wherein the single resistor and the single capacitor are used for both integration and differentiation operations to reduce silicon area.

3. The circuit of claim 1, wherein the first current follower and the second current follower include one or more differential pairs in parallel with a first output stage to provide multiple output currents.

4. The circuit of claim 1, wherein the first current follower and the second current follower include one or more differential pairs in parallel with a first output stage to provide multiple output currents.

5. The circuit of claim 1, wherein a transfer function of the circuit is set as:

$$I_{out} = sCR_2 I_{in}$$

wherein $I_{in}$ is an input current of the circuit, C is a capacitance of the single capacitor, and $R_2$ is a resistance of the second resistor.

6. A reconfigurable integrator/differentiator circuit, comprising:
   a first input terminal;
   a first output terminal;
   a first current follower having a second input terminal, a second inverting output terminal, a third non-inverting output terminal and a fourth inverting output terminal, wherein the second inverting output terminal provides feed back to the first input terminal, and the third non-inverting output terminal is directly connected to the first output terminal;
   a second current follower having a third input terminal, a fifth inverting output terminal, and a sixth non-inverting output terminal, wherein the sixth non-inverting terminal is connected to the third non-inverting terminal of the first current follower;
   a third current follower having a fourth input terminal, a seventh inverting output terminal, and an eighth non-inverting output terminal, wherein the seventh inverting output terminal provides feed back to the fourth inverting output terminal of the first current follower, and the eighth non-inverting output terminal is directly connected to the first input terminal;
   a single capacitor being connected between the fourth inverting output terminal of the first current follower and ground;
   a first resistor being connected between the first input terminal and the second input terminal of the first current follower;
   a second resistor being connected between the fifth inverting output terminal of the second current follower and the fourth input terminal of the third current follower; and
   a third resistor being connected between the seventh inverting output terminal of the third current follower and the third input terminal of the second current follower.

7. The circuit of claim 6, wherein respective input stages and output stages of the first current follower and the second current follower operate independently through controlling a biasing current at the output stages.

8. The circuit of claim 6, wherein the circuit operates as an integrator when output stages of the first current follower are turned on and output stages of the second current follower are turned off, and the circuit operates as a differentiator when the output stages of the first current follower are turned off and the output stages of the second current follower are turned on.

9. The circuit of claim 6, wherein output currents of the circuit are set as:

$$I_{Diff} = sCR_2 I_{in}$$
$$I_{Intg} = \frac{1}{sCR_3} I_{in}$$

wherein $I_{in}$ is an input current of the circuit, C is a capacitance of the single capacitor, and $R_2$ is a resistance of the second resistor, and $R_3$ is a resistance of the third resistor.

10. The circuit of claim 9, wherein a function of the circuit is obtained by setting the unwanted current between $I_{Diff}$ and $I_{Intg}$ to zero.

11. A simulated inductor, comprising:
a first input terminal;
a first current follower having a second input terminal, a first inverting output terminal and a second non-inverting output terminal, wherein the first inverting output terminal provides feedback to the first input terminal;
a second current follower having a third input terminal, a third inverting output terminal, and a fourth non-inverting output terminal, wherein the third inverting output terminal provides feedback to the second non-inverting output terminal of the first current follower, and the forth non-inverting output terminal is connected to the first input terminal;
a single capacitor being connected between the second non-inverting output terminal of the first current follower and ground;
a first resistor being connected between the first input terminal and the second input terminal of the first current follower; and
a second resistor being connected between the second non-inverting output terminal of the first current follower and the third inverting input terminal of the second current follower.

12. The inductor of claim 11, wherein an input impedance of the inductor is set as:

$$Z = sCR_1 R_2$$

wherein C is a capacitance of the single capacitor, $R_1$ is a resistance of the first resistor and $R_2$ is a resistance of the second resistor.

* * * * *